United States Patent
Schloesser et al.

(10) Patent No.: US 6,798,014 B2
(45) Date of Patent: Sep. 28, 2004

(54) SEMICONDUCTOR MEMORY CELL AND SEMICONDUCTOR COMPONENT AS WELL AS MANUFACTURING METHODS THEREFORE

(75) Inventors: Till Schloesser, Dresden (DE); Franz Hofmann, Munich (DE)

(73) Assignee: Infineon Technologies, AG, Münich (DE)

( * ) Notice: Subject to any disclaimer, the term of this patent is extended or adjusted under 35 U.S.C. 154(b) by 0 days.

(21) Appl. No.: 10/140,393

(22) Filed: May 7, 2002

(65) Prior Publication Data

US 2003/0099131 A1 May 29, 2003

(30) Foreign Application Priority Data

May 7, 2001 (DE) .......................................... 101 22 075

(51) Int. Cl.[7] .............................................. H01L 29/788
(52) U.S. Cl. ...................... 257/316; 257/314; 257/321; 257/324; 257/410; 257/411
(58) Field of Search ................................ 257/316, 314, 257/321, 324, 411, 410

(56) References Cited

U.S. PATENT DOCUMENTS 5,952,692 A * 9/1999 Nakazato et al. ............ 257/321
6,339,000 B1 * 1/2002 Bhattacharya et al. ...... 438/261

FOREIGN PATENT DOCUMENTS

EP          0901169 A1 * 3/1999
EP          0908954 A2 * 4/1999

* cited by examiner

*Primary Examiner*—Richard Elms
*Assistant Examiner*—Douglas Menz
(74) *Attorney, Agent, or Firm*—Schiff Hardin LLP (57) ABSTRACT

A semiconductor memory cell with a storage transistor, a selection transistor and a layer structure is provided. The layer structure is formed of at least two semiconductor layers separated from one another by a dielectric. A control electrode that controls a current flow through the layer structure is arranged at at least one end face of the layer structure. The layer structure forms what is referred to as a PLED device.

12 Claims, 9 Drawing Sheets

SEMICONDUCTOR MEMORY CELL AND SEMICONDUCTOR COMPONENT AS WELL AS MANUFACTURING METHODS THEREFORE

BACKGROUND OF THE INVENTION

The invention is in the field of semiconductor technology and is directed to a semiconductor memory cell having a layer structure that comprises at least two semiconductor layers with a dielectric lying therebetween and at least one control electrode for controlling a current flow through the layer structure, whereby the control electrode is arranged at an end face of the layer structure formed by the semiconductor layers and the dielectric upon interposition of an insulating layer and is connected to a word line;

having a bit line (BL);

and having a storage transistor, whereby the layer structure connects the bit line with the gate electrode of the storage transistor.

Prior and higher demands are being made of the functionability of semiconductor components with increasing miniaturization and integration density. Given, for example, semiconductor components that become smaller and smaller, it becomes increasingly more difficult to dependably suppress leakage currents. In what are referred to as PLEDs (planar localized electron devices), the problem of the leakage currents is to be alleviated by tunnel barriers in the channel region. The structure and the functioning of a PLED is described, for example, in the technical article by Nakazato et al, IEDM 97, pages 179–182, as well as in the previously published conference paper by Nakazato et al, "Phase-state Low Electron-number Drive Random Access Memory (PLEDM)", ISSCC 2000, Feb. 8, 2000, Paper TA 7.4.

The structure of a PLED can be briefly summarized in the following way. The "channel region" of the PLED is formed by a layer structure of what are generally intrinsic semiconductor layers separated from one another by tunnel barriers, the layer structure being arranged between a source zone and a drain zone. A gate or control electrode that is insulated from the semiconductor layers is seated at an end face of the semiconductor layers. Given a voltage difference that is built up between source zone and drain zone, a flow of current is prevented on the basis of the potential walls formed by the tunnel barriers. The probability of a tunnel current is practically zero. Given a suitably selected gate voltage, the curve of the potential of the potential walls is lowered, so that the probability of a tunnel current through the tunnel barriers increases. A measurable tunnel current flows.

The functioning of the PLED can also be described by the course of the energy bands. In the off condition, the band spacing between conduction band and the Fermi edge is generally extremely high. This distance can be reduced by a modification of the gate voltage or can even be increased further. Given an adequately reduced distance, charge carriers can proceed with increased probability from the valence band into the conduction band (for example, due to thermal excitation). As a result thereof, charge carriers are available for a current flow.

Compared to a MOSFET, the PLED, on the one hand, in fact exhibits a low current yield; on the other hand, however, it exhibits an extremely high blocking effect with disappearing leakage current. The semiconductor memory cells disclosed in the prior art, for example in EP 0 843 360 A1, EP 0 901 169 A1 and EP 0 908 954 A2 require at least four interconnected lines, even five interconnected lines in some cases, for their drive. This increases the process expense for manufacturing such semiconductor memory cells. Moreover, the drive is complicated. Over and above this, the coupling ratio between word line and gate of the storage transistor is relatively slight in the prior art, so that the functioning of the known semiconductor memory cells is deteriorated.

SUMMARY OF THE INVENTION

It is an object of the invention to specify a semiconductor memory cell having an improved drive given a comparatively simple structure.

This object is achieved in that the semiconductor memory also comprises a selection transistor lying in series with the storage transistor, the gate electrode thereof being connected to the control electrode of the layer structure and to the word line, whereby the selection transistor and the storage transistor are arranged between the bit line and a ground line.

The invention is also based on an object of specifying a method for manufacturing a semiconductor memory cell. This object is achieved by a method for manufacturing a semiconductor memory cell having the steps of:

forming a layer sequence on a substrate, said layer sequence comprising at least two semiconductor layers with a dielectric lying therebetween;

etching the layer sequence upon employment of at least one mask down to the substrate, so that individual layer structures remain on the substrate;

forming insulation layers at at least one lateral surface of each layer structure as well as on the uncovered substrate and a word line proceeding thereat along the lateral surface of the layer structures is formed, said word line at least partially covering the insulation layer formed on the substrate;

forming doping regions laterally from the layer structures and the word line;

applying an insulating layer surface-wide; and forming a via opening through the insulating layer to one of the doping regions.

An exemplary embodiment is shown in the Figures below.

DESCRIPTION OF THE PREFERRED EMBODIMENTS

For the purposes of promoting an understanding of the principles of the invention, reference will now be made to the preferred embodiment illustrated in the drawings and specific language will be used to describe the same. It will nevertheless be understood that no limitation of the scope of the invention is thereby intended, such alterations and further modifications in the illustrated device, and/or method, and such further applications of the principles of the invention as illustrated therein being contemplated as would normally occur now or in the future to one skilled in the art to which the invention relates.

In the disclosed embodiment only two connected lines in addition to the ground line are required, namely a word line and a bit line. Further, the semiconductor memory cell comprises a selection transistor connected in series with the storage transistor. The gate electrode of the storage transistor is connected to the bit line via the layer structure. The layer structure itself can be viewed as a PLED and comprises an insulated control electrode. This control electrode and the gate electrode of the selection transistor are connected to the word line.

The functioning of this semiconductor memory cell can be explained in the following way: the information to be stored is stored in the gate electrode of the storage transistor in the form of charges. The charge stored there, as is usual in MOSFETs, leads to the formation of an inversion layer in the channel region of the storage transistor when the voltage difference built up by the stored charge is greater than the cutoff voltage of the storage transistor. The voltage difference that is built up is thereby dependent both on the stored charge as well as on the capacitance prevailing between the gate electrode and the channel region. When, in contrast, no charge is stored on the gate electrode, an inversion layer is likewise also not built up. The storage transistor is thus closed. The read-out of the condition of the storage transistor occurs by measuring a flow of current through the storage transistor. In this case, one also speaks of a gain cell. When this is opened (inversion layer present), a measurable current flows. In contrast thereto, a closed storage transistor inhibits the current flow. In order to be able to implement this measurement, the selection transistor must likewise be opened, so that the voltage difference applied between bit line and ground line can drop off via the storage transistor. The selection transistor is opened by means of a voltage applied with the word line that is higher then the cutoff voltage of the selection transistor.

For writing the information into the semiconductor memory cell, in contrast, charge must be transported from and to the gate electrode of the storage transistor via the layer structure. For this purpose, the conductivity of the layer structure is increased by applying a voltage to the control electrode of the layer structure. It must thereby be noted that the cutoff voltage, i.e. the minimally required voltage present at the control electrode, should be higher than the cutoff voltage of the selection transistor, so that the selection transistor can in fact be opened for the reading but the layer structure still remains closed. When writing, in contrast, both selection transistor as well as layer structure are opened. It is therefore preferred when the selection transistor and the layer structure are fashioned such that the cutoff $U_A$ of the selection transistor is lower than the cutoff $U_p$ of the layer structure. This can be achieved, for example, by means of a different thickness of the respective dielectrics.

The reading thus functions in non-destructive fashion given a voltage $U_{WL}<U_p$ adjacent at the word line. When the cutoff voltage difference $\Delta U=U_p-U_A$ is too small for a destruction-free reading, reading can also be undertaken with rewriting, i.e. the value that is read out is subsequently stored again. Insofar as the blocking properties of the layer structure are high enough, a periodic refresh of the charge that is stored can be foregone. In this case, the semiconductor memory cell would be non-volatile.

The semiconductor memory cell is also distinguished by a relatively low space consumption, this lying between 4–6 $F^2$, where F references the structuring width employed in the manufacture. This is highly dependent on the resolution of the lithography that is applied. Given a lithographically minimally obtainable structuring width of, for example, 0.1 µm, F=0.1 µm applies. Since the semiconductor memory cell does not require a capacitor and does not require any high voltage for the operation thereof, the semiconductor memory cell can be fully scaled, i.e. its structure need not be adapted to a specific structural width but retains its fundamental structure independently thereof. In particular, the semiconductor memory cell can be proportionally reduced in size together with the structural width.

One advantageous development is in that the selection transistor and the storage transistor are formed by two doping regions spaced from one another with a channel region lying therebetween and a bipartite gate electrode that is insulated from the channel region, whereby the two parts of the gate electrode are insulated from one another, and the one part of the bipartite gate electrode forms the gate electrode of the selection transistor and the other part of the bipartite gate electrode forms the gate electrode of the storage transistor.

In this development, the concept of a transistor having a divided gate (what is referred to as split gate transistor) is applied. Given two series-connected transistors, either the source region of the one transistor can be connected to the drain region of the other in general or these two regions are formed by a single doping region, so that the transistors lying behind one another together comprise only three doping regions with channel regions therebetween. Given a split gate transistor, in contrast, even the shared doping region is foregone. In contrast thereto, two gate electrodes that are insulated from one another and lie side-by-side are now arranged over what is the single channel region. A flow of current through the channel region is only possible when a voltage is applied to both gate electrodes, this voltage being higher than the respective cutoff voltage. When such a voltage is present at only one of the two gate electrodes, an inversion layer is likewise generated only in a part of the channel region. A flow of current through the channel region is then not yet possible.

The space consumption is clearly especially reduced by the formation of the storage and selection transistor as transistor with divided gate electrode.

It is also advantageous when the storage transistor and the selection transistor are planarly designed in a semiconductor substrate, and the layer structure with laterally arranged control electrode is arranged on the semiconductor substrate. In an advantageous development, the gate electrode of the selection transistor and the control electrode of the layer structure can thereby be directly formed by the word line proceeding laterally at the layer structure.

It is also beneficial when the dielectric of the layer structure is formed of oxynitride and when the semiconductor layers of the layer structure are composed of intrinsic or of lightly doped polysilicon.

Finally, it is preferred when the semiconductor layers of the layer structure are covered by a respective dielectric layer at their sides facing away from one another, the dielectric layer separating the semiconductor layers from conductive regions, whereby a conductive region forms the gate electrode of the storage transistor and the other conductive region is connected to the bit line. The conductive regions thereby form the source and drain zones of the semiconductor component defined by the layer structure. Advantageously, one of the conductive regions simultaneously forms the gate electrode of the storage transistor. It is thereby preferred when the conductive regions are formed of doped polysilicon and when the dielectric layers are formed of silicon nitride.

Fundamentally, it is also possible to provide more than two semiconductor layers, between which an oxynitride then respectively lies. As a result thereof, the blocking effect of the layer structure can be increased. This is disclosed in greater detail in, for example, EP 0 843 360 A1, the disclosure thereof being herewith incorporated.

In the disclosed method embodiment, the semiconductor layers of the layer structure are respectively covered by a dielectric layer at their sides facing away from one another, said dielectric layer separating the semiconductor layers from conductive regions, whereby the conductive region lying between the layer structure and the semiconductor substrate is separated from the semiconductor substrate by a gate dielectric. The gate dielectric, the lower conductive region with its dielectric layer, the layer sequence and the upper conductive region with its underlying dielectric layer are thereby successively applied onto the substrate and subsequently structured. A layer sequence comprising gate dielectric, lower conductive region, dielectric layer, the individual layers of the layer structure, dielectric layer and upper conductive layer is thus planarly applied onto the substrate and subsequently preferably structured in common, whereby a common mask is preferably employed that serves for the definition of the lateral expanse of the layer structure. All etched layers thus comprise the same lateral expanse as the layer structure.

Preferably, the word lines are formed of conformally deposited and anisotropically etched-back, conductive material.

It is also preferred that the layer structures are respectively arranged in pairs and that conformally depositive conductive material exhibits such a material thickness that it fills up the interspace between the layer structures of a pair to such an extent that it continues to completely cover the substrate lying threat between the layer structures of a pair following the anisotropic etching. The layer structures can also proceed behind one another in rows, whereby respectively two rows are combined in pairs and the interspace between two layer structures of a pair is respectively smaller then the spacing between the layer structures of neighboring pairs.

It is therefore preferably possible that
the via opening in the insulating layer leads to the interspace, whereby the conductive material lying in the interspace is likewise removed;
a doping region is created in the substrate uncovered thereat; and
insulating edge webs are formed at those sidewalls of the layer structure facing toward the interspace, whereby the edge webs are thicker then the gate dielectrics of the layer stack.

Due to the slighter spacing of the layer structures within a pair, the conformally deposited, conductive material grows together in the interspace of a pair and therefore largely completely fills up this interspace. The filling height in the interspace is thereby higher then the layer thickness of the conformally deposited, conductive material. In the following anisotropic etching process, the conductive material is therefore not completely removed from the interspace; rather, it continues to cover the substrate therein. In a following implantation, a formation of doping regions is thus suppressed thereat. Only after the removal of the conductive material from the interspace given the assistance of a further etching process can a doping region be formed there.

In the semiconductor memory cells with PLEDs disclosed in the aforementioned technical article as well as in EP 0 843 360 A1, EP 0 908 954 A2 and EP 0 901 169 A1, the tunnel barriers are either thermally formed silicon nitride or silicon oxide layers. These layers, however, exhibit excessively high leakage currents, so that they are suitable as tunnel barriers. A purely thermally formed silicon nitride layer can thus not be thicker then approximately 25 nm This thickness, however, does not suffice for an adequate minimization of leakage currents. Moreover, the hole density of these layers leaves something to be desired. It is therefore a further object of the present invention to specify PLEDs with better tunnel barriers.

A semiconductor component is therefore also proposed
having a layer structure of at least two semiconductor layers with a dielectric lying therebetween, whereby the semiconductor layers are respectively covered by a dielectric layer at the side facing away from one another, said dielectric layer separating the semiconductor layers from conductive regions; and
having a control electrode that is arranged at an end face of the layer structure formed at least by the semiconductor layers and the dielectric upon interposition of an insulating layer and that controls a flow of current through the layer structure,
whereby the dielectric is comprised of oxynitride and the dielectric layers are comprised of silicon nitride.

Oxynitride layers are distinguished by extremely low leakage currents and are specifically distinguished by an extremely low hole density. Moreover, they can be very cleanly manufactured by thermal oxidation of a nitride layer.

Further, a method having the following steps is proposed:

a) a substrate having a conductive region is offered;
b) a semiconductor layer and a nitride layer are applied;
c) the nitride layer is thermally oxidized and is thereby converted into an oxynitride layer,
d) a further semiconductor layer is applied onto the oxynitride layer,
e) a further conductive region is formed on the semiconductor layer,
f) a mask is applied onto the further conductive region and all previously applied layers are etched at least down to the conductive region upon employment of the mask, so that a layer structure having at least one end face arises; and
g) an insulation layer and a control electrode are formed on this end face.

Preferably, the steps b) and c) can be multiply repeated in order to produce a plurality of semiconductor layers having a respective oxynitride layer lying thereabove.

It is thereby beneficial when
the conductive region is formed as a doped polysilicon layer that, after its formation, is thermally nitrated, so that the polysilicon layer is covered by a silicon nitride layer,
the semiconductor layers are comprised of intrinsic polysilicon or a polysilicon that is lightly doped in comparison to the conductive regions, and the further semiconductor layer is thermally nitrated, so that it is covered by a silicon nitride layer, and the further conductive region is designed as a doped polysilicon layer.

Due to the silicon nitride layers that are formed, the semiconductor layers, which are preferably comprised of intrinsic or lightly doped polysilicon, are insulated from the more highly doped, conductive regions. The lightly doped polysilicon exhibits a doping of, preferably, less then $5*10^{17}$ cm$^{-3}$. By comparison, the doping of the conductive regions, in contrast, is preferably higher than $10^{19}$ cm$^{-3}$. The silicon nitride layers are thus both tunnel barriers as well as diffusion barriers in order to prevent a diffusion of dopants from the conductive regions into the semiconductor layers. Such a diffusion could, for example, occur in the thermal oxidation of the nitride layer. It has been found that the retention of the intrinsic conductivity or, respectively, of the light doping of the semiconductor layers is advantageous for the functioning of the semiconductor components manufactured in this way. It is thereby assured that the electrical field impressed by the control electrode can penetrate deeply into the semiconductor layers. More highly doped semiconductor layers, in contrast, shield the impressed electrical field of the control electrode. This could therefore no longer penetrate deeply enough into the semiconductor layers, so that the curve of potential of the tunnel barriers could be influenced only in the immediate proximity of the control electrode.

Figure 1:
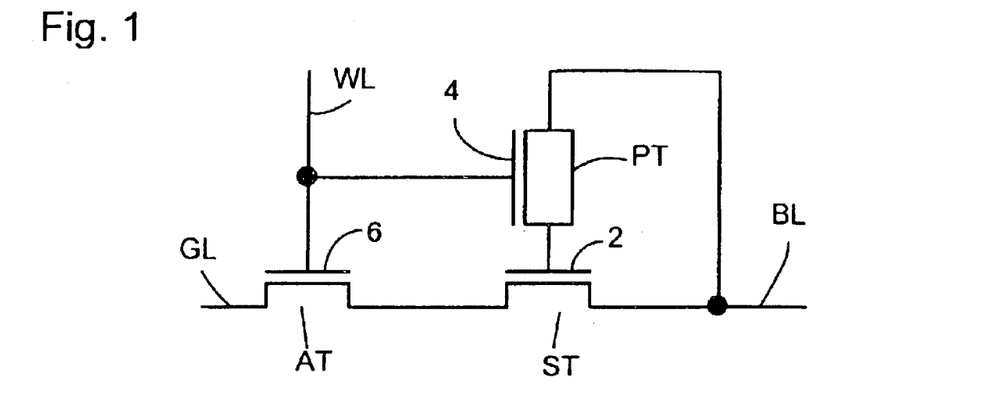
FIGS. 1 through 3 show a semiconductor cell with different wiring.

FIG. 1 shows a semiconductor memory cell—referred to below as memory cell—, whereby the storage transistor ST is connected to the bit line BL and to the selection transistor AT and this is in turn connected to the ground line GL. The semiconductor component formed by the layer structure—referred to below as PLED—is likewise connected to the bit line and to the gate 2 of the storage transistor ST. The control electrode 4 of the PLED PT is connected both to the word line WL as well as to the gate electrode 6 of the selection transistor AT.

Figure 2:
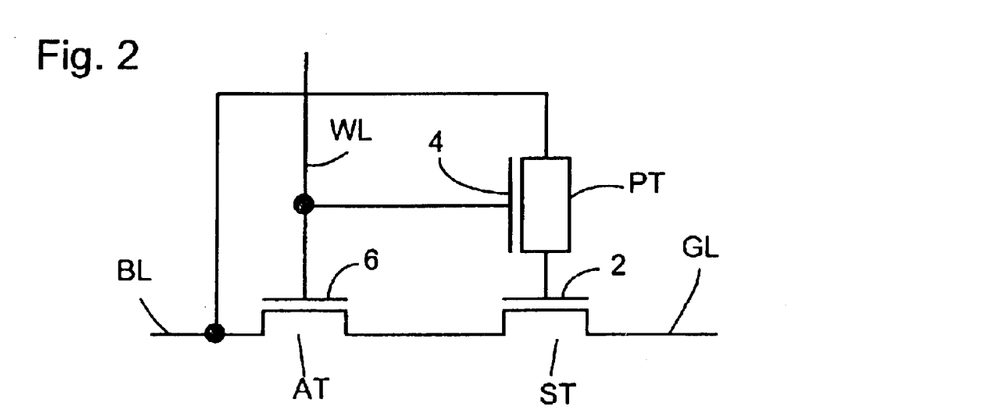

Differing from the memory cell shown in FIG. 1, the selection transistor in FIG. 2 is connected to the bit line BL and to the PLED PT. The storage transistor thereby has its drain side lying at the ground line GL. Both wirings shown in FIGS. 1 and 2 are fundamentally equivalent. The memory cell shown in FIG. 2 has the further advantage that no disturbances occur at the drain side of the PLED.

Figure 3:
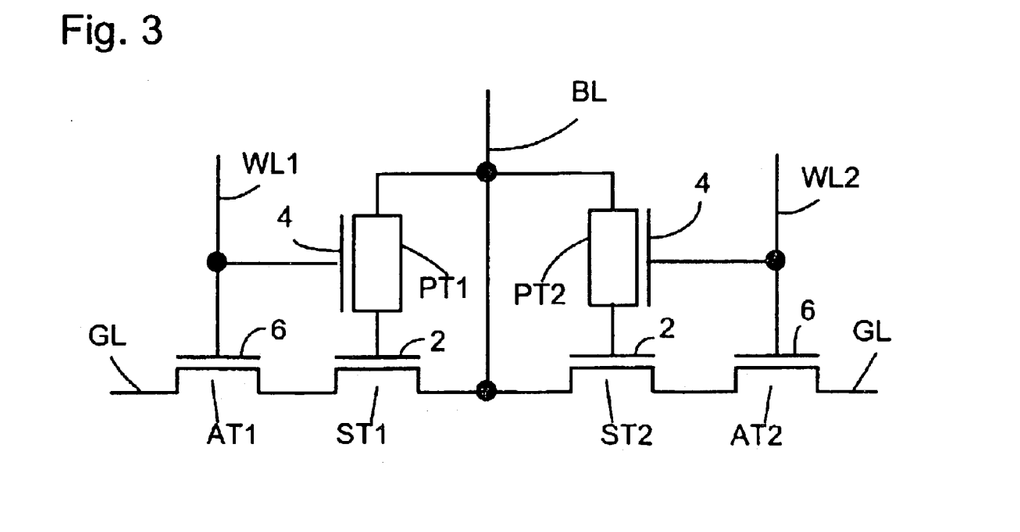

FIG. 3 shows neighboring memory cells that share a common bit line BL in order to reduce the plurality of interconnects required. Alternative arrangements for minimizing space are likewise possible.

Figure 4:
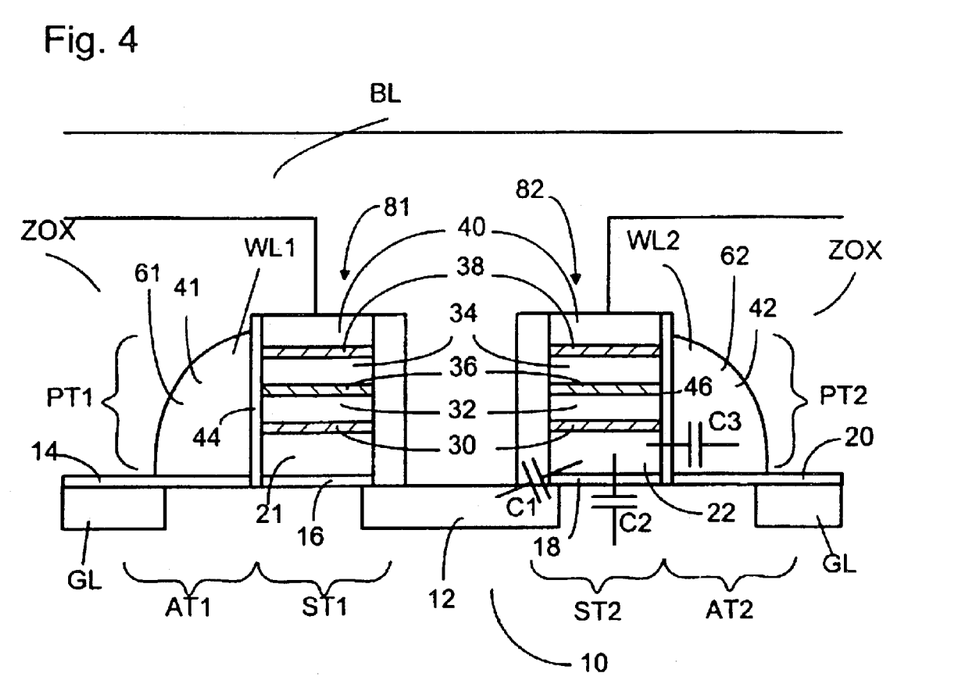
FIG. 4 shows a cross-section through two semiconductor memory cells.

A cross-section through two neighboring memory cells having the wiring shown in FIG. 3 is illustrated in FIG. 4. n-doping regions spaced from one another are arranged in a substrate 10 preferably comprised of monocrystalline, p-doped silicon. The dopings, however, can also be reversed. The two outer doping regions represent driven-in ground lines GL. The middle doping region 12 forms the shared source zone of the storage transistors ST1 and ST2 and is connected to the bit line BL. Gate dielectrics 14, 16, 18 and 20 are arranged on the substrate 10 respectively between the doping region 12 and the driven-in ground lines GL. The word lines WL1 or, respectively, WL2 proceed above the gate dielectrics 14 and 20, said word lines simultaneously forming the gate electrode 61 or, respectively, 62 of the selection transistors AT1, AT2 as well as the control electrode 41 or, respectively, 42 of the PLEDs PT1 and PT2 thereat. The gate electrodes 21 and 22 of the storage transistors ST1 and ST2 are seated above the gate dielectrics 16 and 18. The gate electrodes 21, 22 simultaneously form conductive regions of the layer structures 81 and 82 arranged above the gate electrodes 21, 22. The layer structures 81 and 82 thereby respective comprise a silicon nitride layer 30 in addition to the conductive regions 21 and 22, also comprise two preferably intrinsic semiconductor layers 32 and 34 with oxynitride layer 36 lying therebetween, a further silicon nitride layer 38 and a further conductive region 40. The layer structures 81 and 82 are laterally insulated from the bit line contact with an oxide layer 42 and from the word line WL1 and WL2 by means of a second gate dielectric 44, 46. The bit line BL itself is seated on an oxide layer ZOX.

Together with the channel regions respectively lying therebetween, the ground lines GL and the doping region 12 form the common source, drain and channel regions of the selection transistors and storage transistors AT1 and ST1 or, respectively, AT2 and ST2. Above the respective channel regions, split gates are formed by the word lines WL1 and WL2 located thereat as well as by the gate electrodes 21 and 22. Conductive channels between the left-hand ground line GL and the doping region 12 or, respectively, between the right-hand ground line GL at the doping region 12 are only generated when both the work lines WL1 or, respectively, WL2 and the gate electrodes 21 or, respectively, 22 are charged with a suitable voltage.

The functioning of the memory cell shall be explained in greater detail below with reference to FIG. 5. Given a single write access onto the memory cell, it is fundamentally assumed that a value has already been stored, i.e. that charge has collected on the gate electrode 2 of the storage transistor ST corresponding to the value to be stored. Without limitation of the universal applicability, it shall be assumed for illustrating the functioning that logical "0" is to be equated with no collected charge and logical "1" is to be equated to collected charge on the gate electrode.

Figure 5:
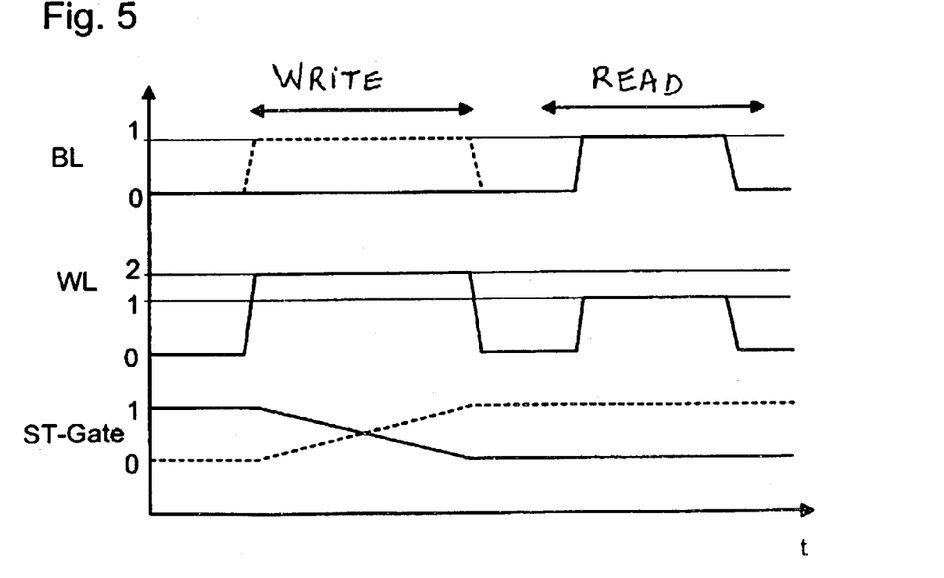
FIG. 5 shows a read-write cycle of a semiconductor memory cell.

The broken line in FIG. 5 denotes writing a "1" given a previously stored "0"; the solid line corresponds to the converse case. Insofar as a "0" is stored, i.e. no charge is on the gate electrode 2, the word line WL is applied to the potential 2 for writing a "1", whereby both the PLED as well as the selection transistor AT is opened, i.e. the voltage difference between bit line BL and ground line GL drops off via the storage transistor ST. This is still closed because of the stored "0". At essentially the same time with the opening of the PLED PT, the bit line is set to "high" (corresponding to 1 in FIG. 5). With the setting of the bit line to "high", a voltage difference should be built up between the gate electrode 2, 21, 22 and the further conductive region 40 of the layer structure, charges being capable of flowing as a result thereof through the PLED to the as yet uncharged gate electrode. The potential of the gate electrode 2, 21, 22 defining the height of this voltage difference is influenced by the potential of the substrate 10 and the potential of the source region 12 and the word line WL1 or, respectively, WL2. To what extent these three potentials define the potential of the gate electrode 2, 21, 22 is highly dependent on the coupling capacitances C1, C2 and C3 that form between gate electrode and the source region 12, the substrate 10 and the word line WL1 or, respectively, WL2. These capacitances are shown byway of example in FIG. 4. C2 dominates since gate electrode 2, 21, 22 and substrate 10 have a large common area compared to the source region 12 and word line WL1 or, respectively, WL2. Since the substrate 10 itself usually lies at reference potential, i.e. at zero, the potential of the gate electrode 2, 21,22 is thus likewise at 0. With the PLED opened, thus, charges flow onto the gate electrode 2, 21, 22. The gate electrode therefore exhibits logical "1".

When, in contrast, a "0" is to be written with a "1" stored, the bit line remains at "low" (corresponding to 0 in FIG. 5), and the charges can flow off. The gate electrode now exhibits a "0".

When writing logical "1", optionally, the potential of the substrate can be lowered in order to keep the storage transistor closed despite an increasing charge on the gate electrode of the storage transistor. In the converse case, in contrast, the potential of the substrate could be additionally boosted.

For reading the stored condition, the word line WL1 or, respectively WL2 is set to potential 1, whereby the PILED is already closed, but the selection transistor AT, AT1, AT2 is still open. At the same time, the bit line is set to "high" (1), so that a voltage difference drops off via the storage transistor. Dependent on whether this is in the condition "1" (open) or "0" (closed), a current flows that can be registered at the bit line BL.

Individual steps in the manufacture of the memory cell shall be described below on the basis of FIGS. 6A through 6I.

Figure 6A:
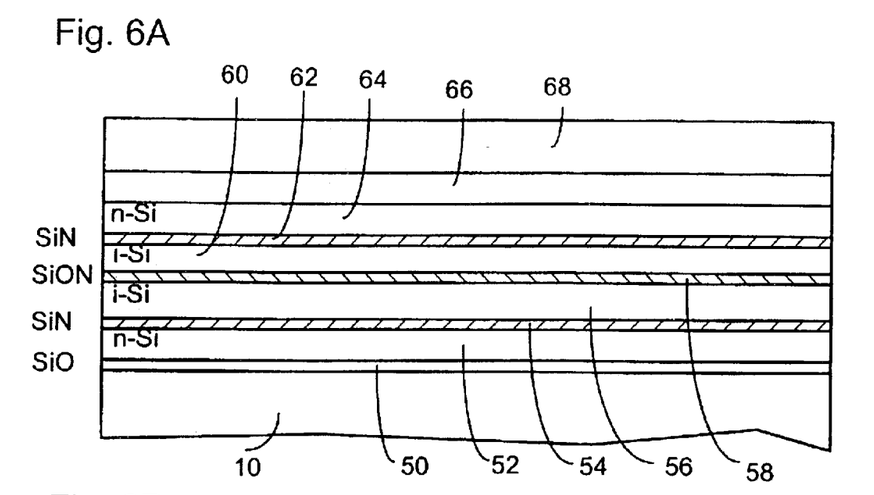
FIGS. 6A through 6I show individual method steps in the manufacture of a semiconductor memory cell.
Figure 6B:
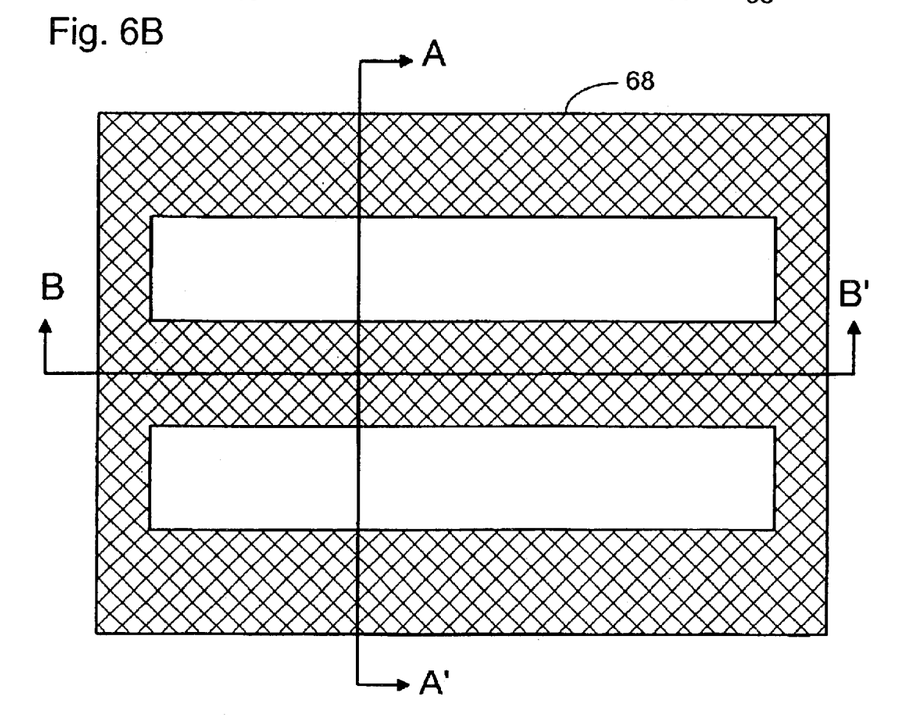

First, a thin oxide layer 50 is thermally formed on the substrate 10, the gate dielectrics 16 and 18 proceeding therefrom later. This is followed by the deposition of an n-doped polysilicon layer 52 of approximately 50 through 100 nm having a dopant concentration of greater then $10^{19}$ cm$^{-3}$. This polysilicon layer is subsequently thermally nitrated in the presence of NH$_3$ at approximately 700° C. through 100° C. A silicon nitride layer 54 thereby arises that is only a few nanometers thick The formation of the silicon nitride layer 54 is self-inhibiting, i.e. the obtainable thickness is largely independently of the selected treatment duration. A few seconds through minutes generally suffice for the thermal treatment. An intrinsically conductive polysilicon layer 56 having a thickness of a few nanometers (approximately 50 nm) is applied onto the silicon nitride layer 54 formed in this way, this being followed by a deposited nitride layer 58. For forming the nitride layer 58, for example, an LP-CVD (low pressure chemical vapor deposition) method can be utilized upon employment of NH$_3$ and silane at temperatures from 700 through 800° C. Subsequently, the nitride layer 58 is subjected to an oxidizing atmosphere at high temperatures, so that the nitride layer 58 converts into an oxynitride layer 58. This is followed by the deposition of another intrinsic polysilicon layer 60 that is likewise thermally nitrated, so that a silicon nitride layer 62 arises. Finally, an n-doped polysilicon layer 64 and a silicon nitride layer 66 serving later as hard mask are applied.

The polysilicon layers 52, 56, 64 are preferably deposited with CVD methods at temperatures from approximately 500 through 650° C. Due to the thermal treatment of the silicon substrate or, respectively, of the polysilicon layers 52, 60, stoichmetric layers generally arise, i.e. SiO$_2$ in the case of the substrate 10 and Si$_3$N$_4$ layers in the case of the polysilicon layers 52, 60. The composition of the oxynitride layer 58 is highly dependent on the duration of the treatment and on the oxygen concentration or, respectively, on the concentration of the oxidizing substance, so that a composition Si$_x$O$_y$N$_z$ is generally achieved.

Finally, a photomask 68 is also applied onto the nitride layer 66 for structuring the layer stack that has been formed. This is suitably exposed and developed. The structured photo-mask 68 arising as a result thereof is to be seen in FIG. 6B. The light bars thereby indicate openings in the photo-mask 68. Subsequently, the layer stack is etched into their and down into the substrate 10 in order to form what are referred to as STI insulation regions (shallow trench isolation). The etching itself is implemented such that the nitride layer 66 is etched first upon employment of the structured photo-mask 68 in order to produce a hard mask.

Figure 6C:
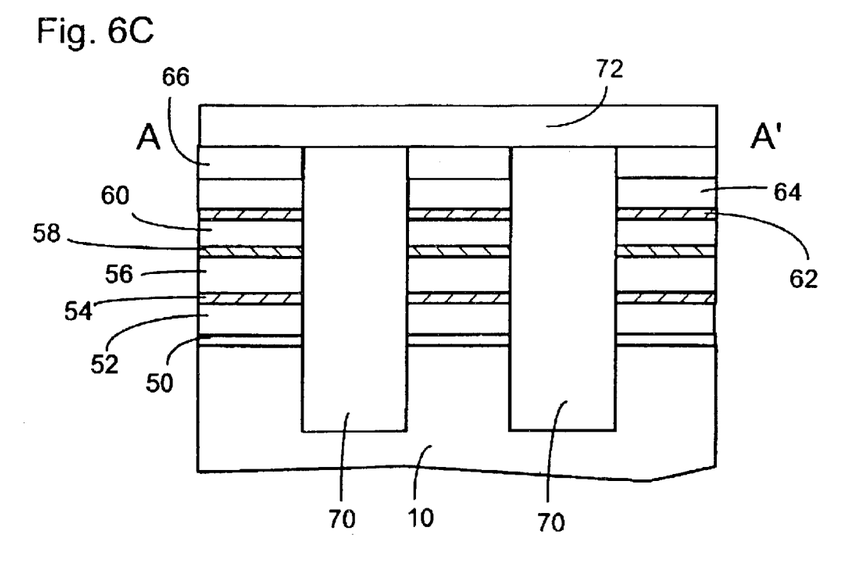
Figure 6D:
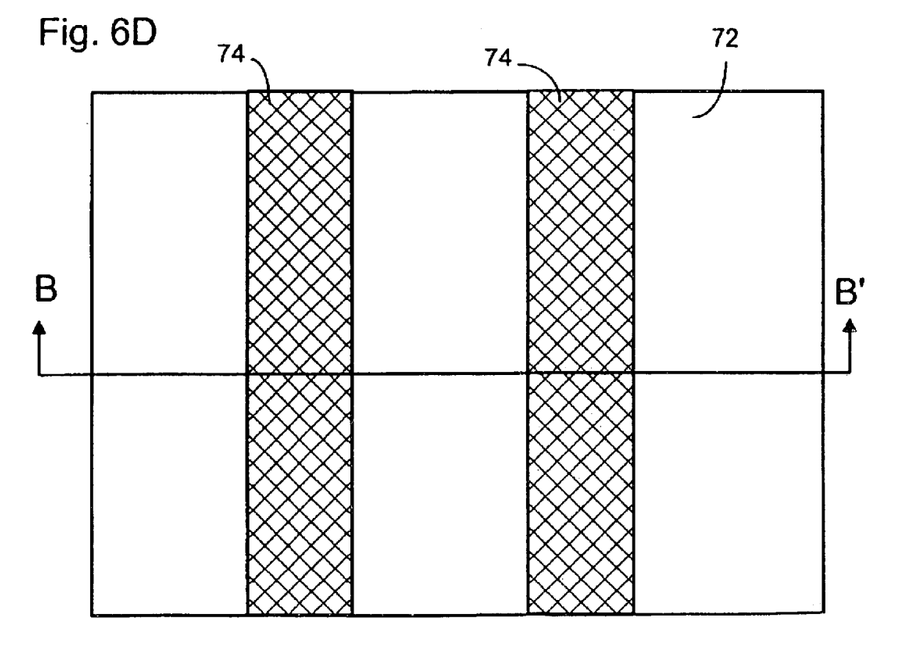
Figure 6E:
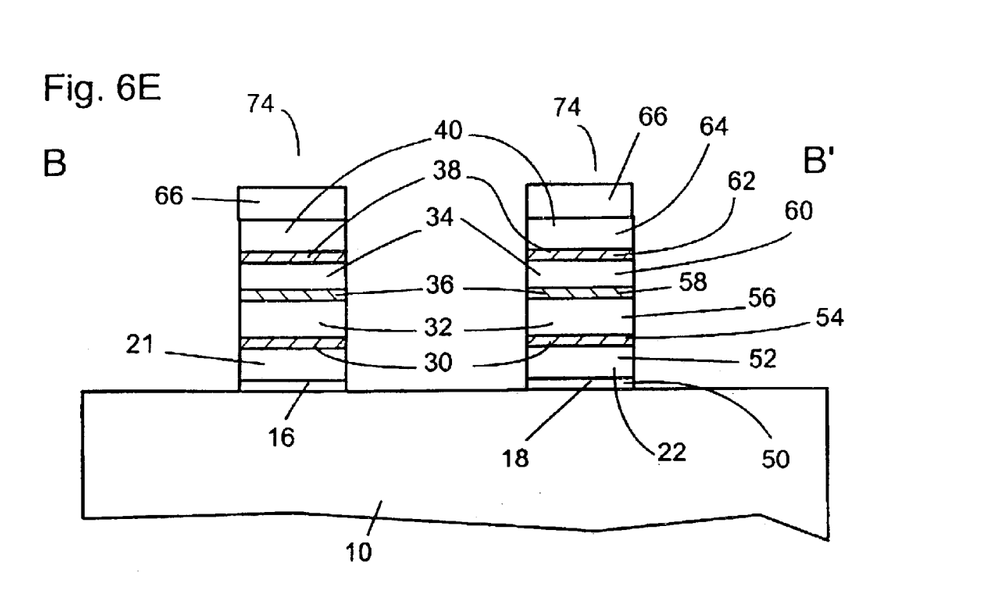

The silicon nitride hard mask 66 structured in this way serves as mask in etching of all layers including the substrate 10. After the trenches defined by the photo-mask 68 have been etched, the uncovered substrate 10 is thermally oxidized for the formation of a thin silicon oxide layer (not shown) and is subsequently filled up with an oxide 70. The latter is planarized with CMP (chemical mechanical polishing). A further photomask 72 is applied onto the planarized oxide layer 70 that preferably terminates with the silicon nitride layer 66. The structure obtained in this way is shown in FIG. 6C along the cross-section AA' indicated in FIG. 6B.

Figure 6F:
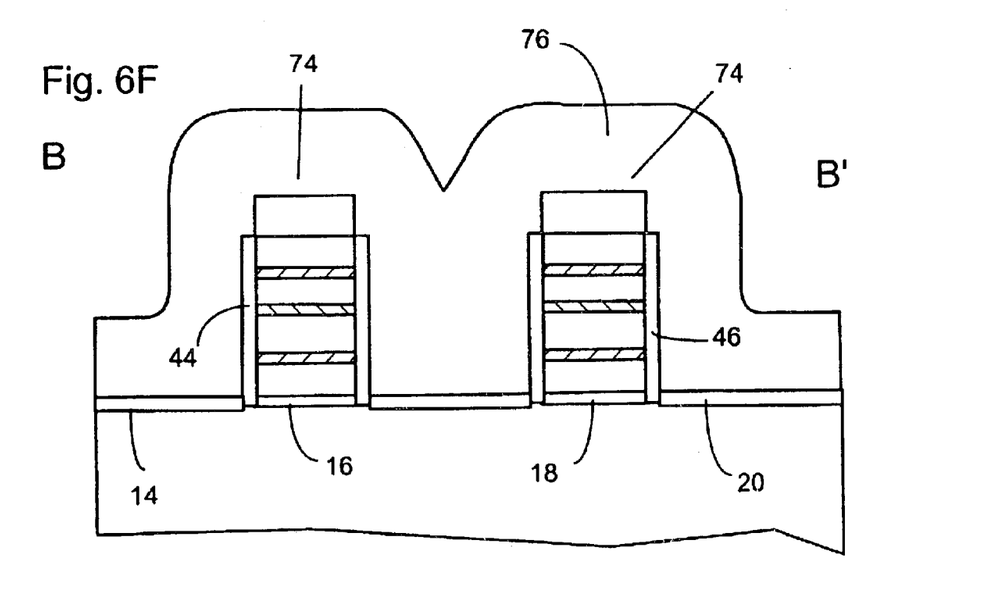

After formation of the webs 74, a thermal oxidation follows wherein the sidewalls of the webs 74 as well as the uncovered substrate 10 are oxidized. Arising as a result thereof on the substrate are the gate dielectrics 14 and 20 already shown in FIG. 4 and—at those lateral surfaces of the webs 7 facing away from one another—the second gate dielectrics 44, 46 likewise already shown in FIG. 4. Although oxide layers likewise arise at the lateral surfaces of the webs 74 facing toward one another, these are removed later. The thermal oxidation is followed by a deposition of an n-doped polysilicon layer 76 with a dopant concentration of $\geq 5*10^{18}$ cm$^{-3}$ that is applied so thick that the interspace between the webs 74 is largely filled up (FIG. 6F). The polysilicon layer 76 is subsequently anisotropically etched back, so that edge webs (spacers) remain at the lateral surfaces of the webs 74 facing away from one another, these spacers forming both the word lines WL1 and WL2 as well as the control electrodes 41, 42 of the PLEDs PT1 and PT2 and the gate electrodes 61, 62 of the selection transistors AT1 and AT2. Due to the relatively thick polysilicon layer 76, adequate polysilicon material remains the webs 74 despite the re-etching, this polysilicon material filling up the interspace 100 between the webs. Upon employment of the etched polysilicon layer 76 and of the webs 74 as mask, n-doping regions are created laterally next to the word lines WL1, WL2 by means of implantation for forming the ground line GL (FIG. 6G) with an implantation dose of approximately 1–10*10$^{15}$ cm$^{-2}$, whereby a final dopant concentration of approximately 10$^{19}$ through 10$^{20}$ cm$^{-3}$ is set. Optionally, a silicide process can follow wherein the implanted and potentially driven-in ground line GL is silicided, for example with Ti, at 900° C. for fifteen minutes.

Insofar as the layer structures 81, 82 or, respectively, the webs are not arranged in pairs but the spacing of the layer structure is so great that the polysilicon layer 76 does not fill up the interspace between neighboring layer structures, one must potentially employ a further mask in order to prevent the doping and silicidation in the interspace.

The individual layers of the webs 74 were respectively provided in FIG. 6F with those reference characters that were employed in FIG. 4 in order to show that the corresponding function layers of FIG. 4 proceed from the deposit to the layers.

Figure 6G:
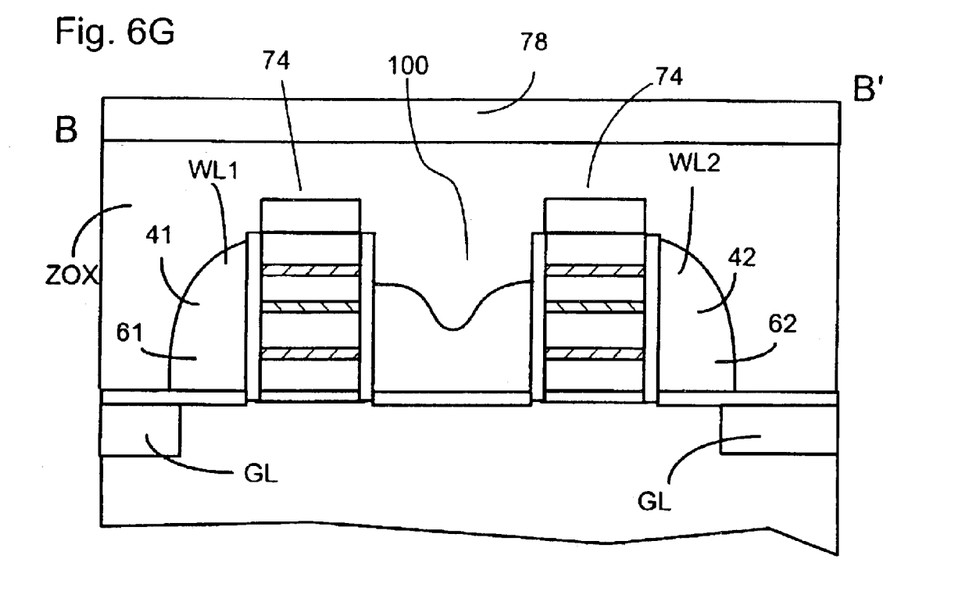
Figure 6H:
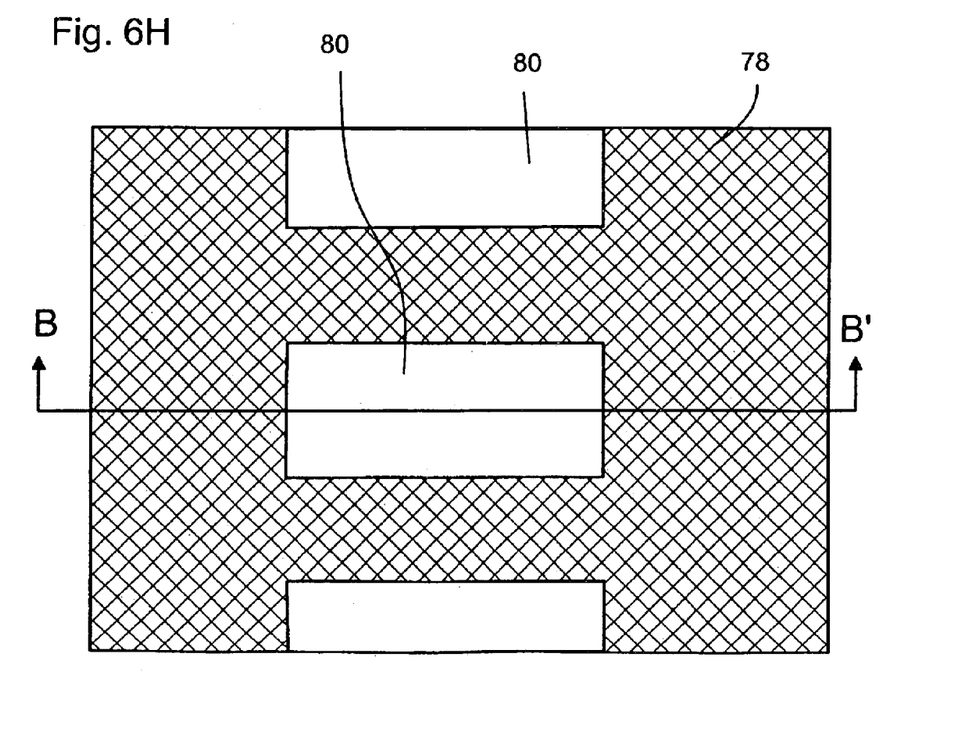
Figure 6L:
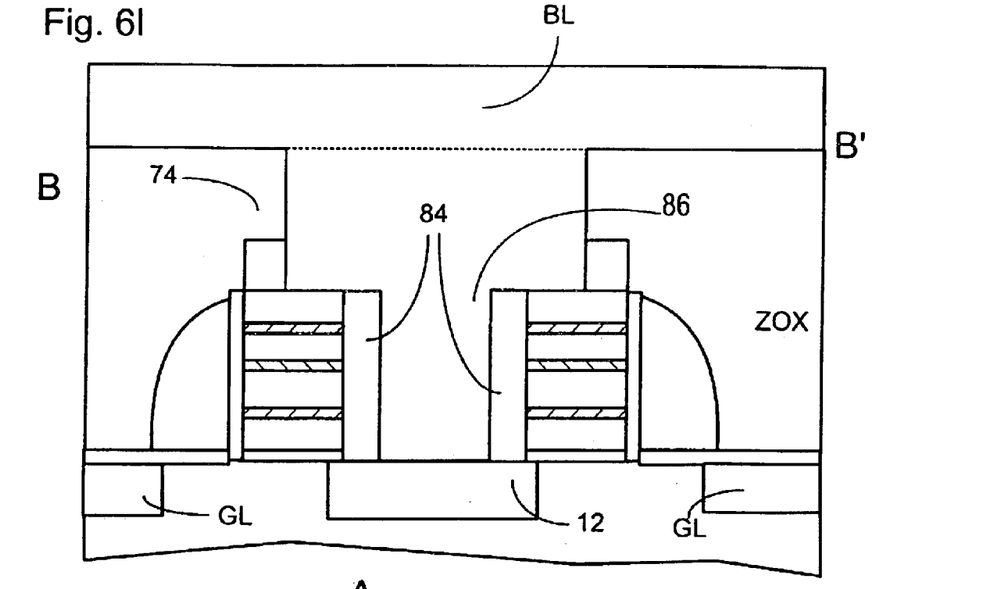

According to FIG. 6G, this is followed by the application of a planarizing oxide layer ZOX and a further photo-mask 78. The layout thereof is shown in FIG. 6H The photo-mask 78 comprises openings at the locations at which the bit line contacts 86 are to be formed. Upon employment of the photo-mask 78, the oxide layer ZOX is etched down onto the substrate 10. The oxide layers that arose due to thermal oxidation are thereby simultaneously removed on the lateral surfaces of the webs 74 facing toward one another as well as on the intervening substrate surface. This is followed by the etching of polysilicon in order to remove the polysilicon material located between the webs 74. As warranted, a final oxide etching also occurs in order to remove the oxide layer located on the substrate surface. The formation of the bit line contacts is self-aligning with reference to the webs 74. The openings 80 in the photo-mask 78 must be of such a size that the webs 74 are partially uncovered, so that a contacting of the upper semiconductor layer 40 is enabled. The word lines WL1, WL2, in contrast, should be not be uncovered. After etching the oxide layer ZOX, the doping region 12 is created by means of implantation of As with a does of approximately $10^{14}$ through $10^{16}$ cm$^{-2}$ and, potentially, with thermal aftertreatment. The doping region 12 serves both storage transistors ST1, ST2 as source region. A deposition of an oxide layer subsequently ensues with anisotropic re-etching for formation of edge webs 84 (spacers) at the lateral surfaces of the webs 47 facing toward one another. The edge webs 84 are clearly thicker than the second gate dielectrics 44, 46 so that the coupling capacitance bit line BL and the semiconductor layers 21, 22, 32, 34, 40 is negligibly slight and the bit line BL does not itself act as control electrode. Subsequently, the nitride layer 66 located on the webs 74 is at least partially removed in order to uncover the further conductive region 40. Finally, the bit line contacts 86 are filled up with a conductive material. This, for example, can be a matter of polysilicon or can be a metallic structure composed of Ti/TiN/W. After the filling of the bit line contacts 86, the bit line BL is applied. The structure obtained in this way is shown in FIG. 6I.

Figure 7:
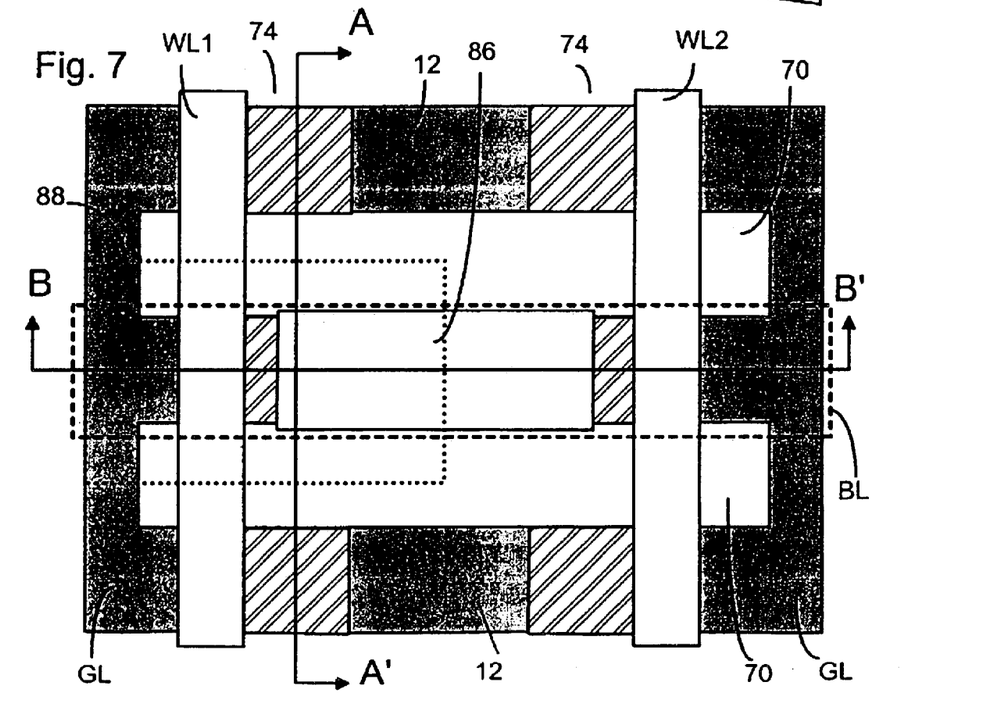
FIG. 7 shows the layout thereby achieved.

The layout of the memory cell that is obtained is shown in plan view in FIG. 7. The layer stacks 81, 82 that form the webs 74 together with the STI regions 70 are shown obliquely hatched. The STI regions 70 themselves are interrupted by the trenches proceeding between the webs 74 wherein the bit line contacts 86 are formed and by the trenches wherein the word lines W11, W12 proceed. For better illustration, only one bit line contact 86 has been shown. The bit line BL proceeds above the bit line contact 86. The substrate 10 is shown gray, whereby the doping regions 12 are seated between the webs 74. The remaining gray regions form the ground line GL. A memory cell occupies the scope referenced 88.

With the above-described manufacturing steps, the semiconductor component has also simultaneously arisen, this comprising an oxynitride layer 36 between the two intrinsic semiconductor layers 32, 34.

Figure 8A:
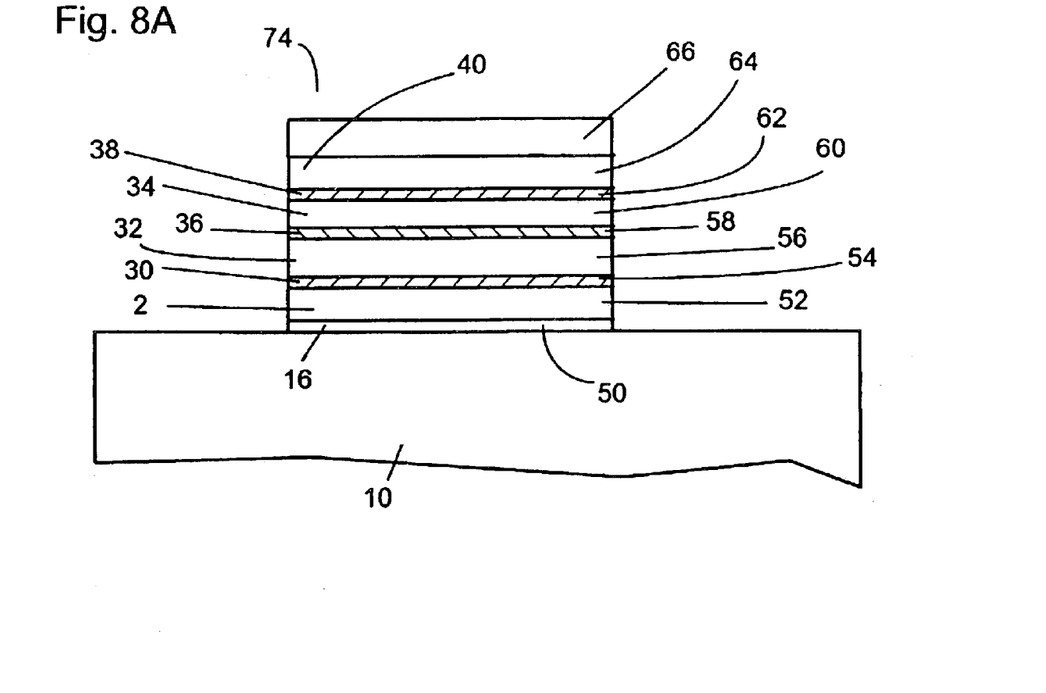
FIGS. 8A through 8D show another embodiment of a manufacturing method.
Figure 8B:
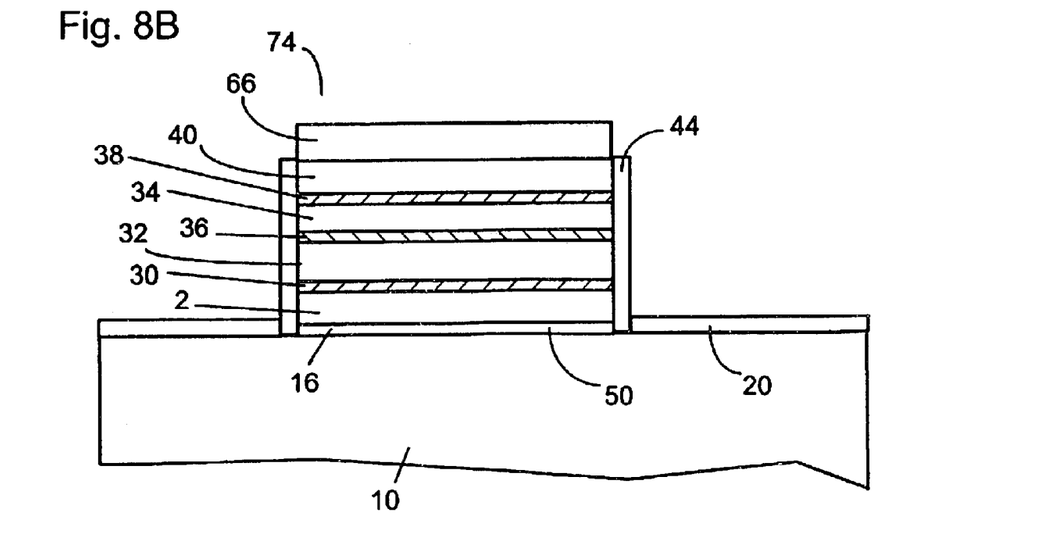
Figure 8C:
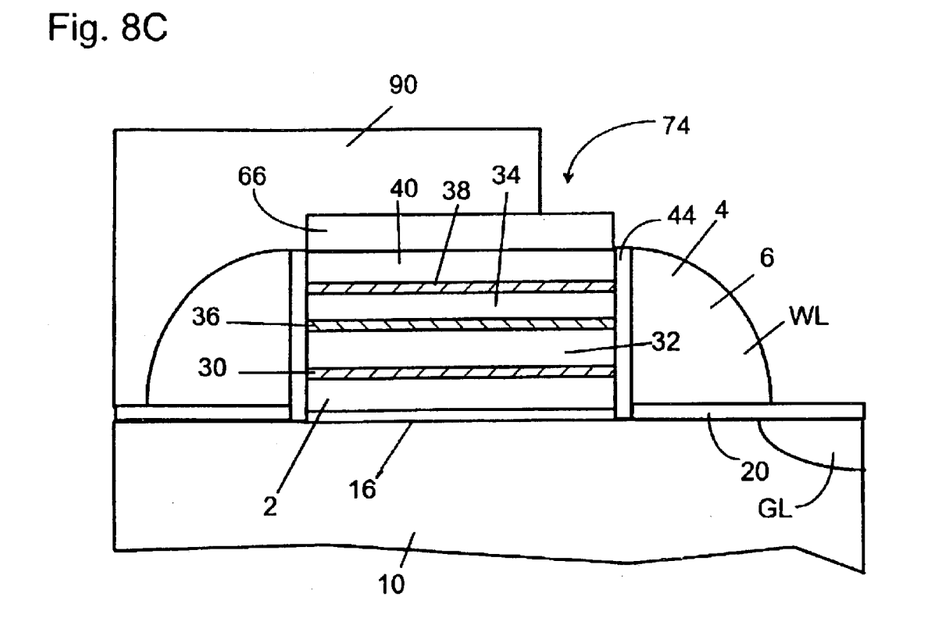
Figure 8D:
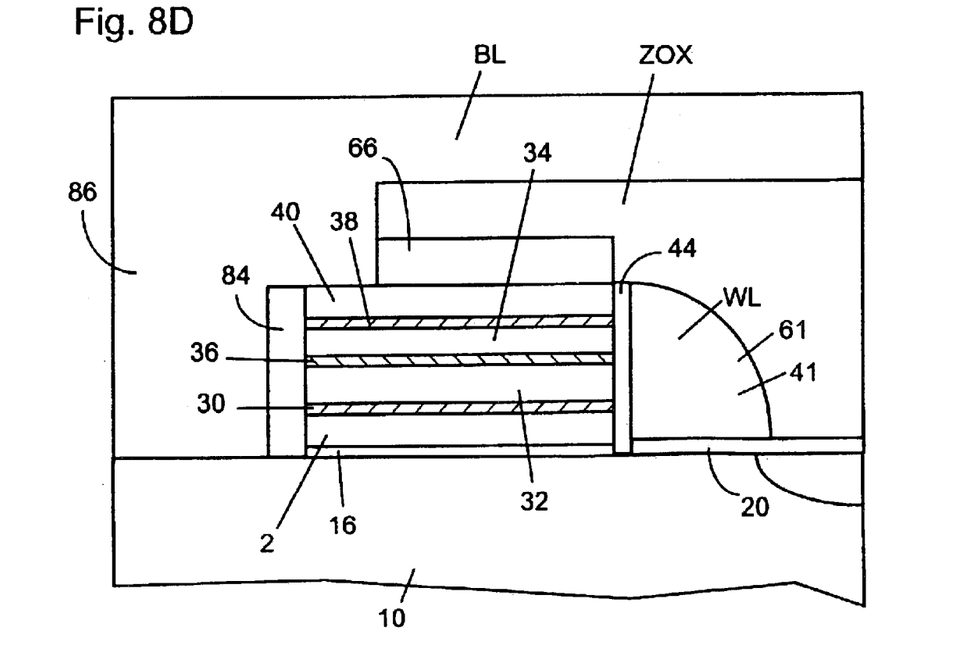

An alternative manufacturing mode for the semiconductor memory cell is shown in FIGS. 8A through 8D. First, all layers already shown in FIG. 6A are applied onto the substrate 10 and are etched for forming the webs 74 upon employment of the masks (not shown here). Analogous to FIG. 6F, this is formed by the formation of gate dielectrics 20 and 44 by thermal oxidation. The structure obtained in this way is shown in FIG. 8B.

Subsequently, a polysilicon layer is conformally applied and subsequently anisotropically etched back, likewise as already indicated in FIGS. 6F and 6G. A self-aligned word line WL thereby arises at both sides of the web 74, these simultaneously forming the gate electrode 6 of the selection transistor 80 and the control electrode 4 of the PLED. Since the individual webs in this version of the manufacturing method are not arranged in pairs with reduced spacing between the webs of a pair but with identical spacing between the individual webs, the word lines arise at each side of the webs. Since, however, a word line should proceed only at one side of each web, the word line formed at the other side is subsequently removed in turn.

First, however, a photo-mask 90 is applied that only allows the region to the side of the web 74 free wherein the word line should remain. Upon employment of this photo-mask a doping region GL is subsequently formed next to the word line, this simultaneously forming the ground line. Optionally, this is followed by the silicidation of the ground line GL. In particular, the word line can thereby likewise be silicided. The photo-mask 90 prevents both the formation of a doping region as well as the silicidation thereof at the other side of the web 74.

Finally, the deposition and structuring of a planarizing oxide layer ZOX follows. The via opening formed lies above the word line to be removed, i.e. at the left side in FIG. 8D. In the formation of the via opening or, respectively, in a following method step, the word line thereat and the gate dielectrics lying thereat are removed. A self-aligning edge web 84 is formed at the end face of the web 74 that is now uncovered (left side in FIG. 8B). This is followed by a nitride etching in order to remove the nitride layer 66 in the region of the via opening and in order to enable the electrical contacting of the further conductive region 40. Finally, the bit line BL is deposited and the via opening to the bit line contact 86 is thereby simultaneously filled.

Alternatively, the word line situated at the left side of the web 74 can also be removed before deposition and structuring of the oxide layer ZOX given the assistance of a mask that covers the remaining regions and, in particular, the word line situated at the right-hand side.

While preferred embodiments have been illustrated and described in detail in the drawings and foregoing description, the same are to be considered as illustrative and not restrictive in character, it being understood that only the preferred embodiments have been shown an described and that all changes and modifications that come within the spirit of the invention both now or in the future are desired to be protected.

We claim as our invention:

1. A semiconductor memory cell, comprising:
    a layer structure comprising at least two semiconductor layers with a dielectric lying therebetween and at least one control electrode for controlling a current flow through the layer structure, the control electrode being connected to a word line and spaced from an end face of said layer structure by an insulating layer;
    a bit line;
    a storage transistor having a gate electrode connected by the layer structure to the bit line; and
    a selection transistor lying in series with the storage transistor and having a gate electrode connected to the control electrode of the layer structure and to the word line, the selection transistor and the storage transistor being arranged in series between the bit line and a ground line.

2. The semiconductor memory cell according to claim 1 wherein the selection transistor and the layer structure are designed such that a cutoff voltage of the selection transistor is lower than a cutoff voltage of the layer structure.

3. The semiconductor memory cell according to claim 1 wherein the selection transistor and the storage transistor are formed by two doping regions spaced from one another with a channel region lying therebetween and a two part gate electrode insulated from the channel region, the two parts of the gate electrode being insulated from one another, and the one part of the bipartite gate electrode forming the gate electrode of the selection transistor and the other part of the two part gate electrode forming the gate electrode of the storage transistor.

4. The semiconductor memory cell according to claim 1 wherein the storage transistor and the selection transistor are planarly designed in a semiconductor substrate, and the layer structure with a laterally arranged control electrode is arranged on the semiconductor substrate.

5. The semiconductor memory cell according to claim 4 wherein the gate electrode of the selection transistor and the control electrode of the layer structure are directly formed by the word line proceeding laterally at the layer structure.

6. The semiconductor memory cell according to claim 1 wherein the dielectric of the layer structure comprises oxynitride and the semiconductor layers of the layer structure comprises one of intrinsic and lightly doped polysilicon.

7. The semiconductor memory cell according to claim 1 wherein the semiconductor layers of the layer structure are covered by a respective dielectric layer at sides facing away from one another, said dielectric layer separating the semiconductor layers from conductive regions, one of the conductive regions forming the gate electrode of the storage transistor and the other conductive region being connected to the bit line.

8. The semiconductor memory cell according to claim 7 wherein the conductive regions comprise doped polysilicon and the dielectric layers comprise silicon nitride.

9. The semiconductor memory cell according to claim 1 wherein a cutoff voltage of the selection transistor is lower than a cutoff voltage of the layer structure.

10. A semiconductor memory cell, comprising:

a layer structure comprising at least two semiconductor layers with a dielectric lying therebetween and at least one control electrode fro controlling a current flow through the layer structure, the control electrode being connected to a word line and spaced from an end face of said layer structure by an insulating layer;

a bit line;

a storage transistor having a gate electrode connected by the layer structure to the bit line;

a selection transistor lying in series with the storage transistor and having a gate electrode connected to the control electrode of the layer structure and to the word line, the selection transistor and the storage transistor being arranged in series between the bit line and a ground line;

a cutoff voltage of the selection transistor being lower than a cutoff voltage of the layer structure; and the selection transistor and the storage transistor being formed by two doping regions with a channel region lying therebetween and a two part gate electrode.

11. A semiconductor component, comprising:

a layer structure of at least two semiconductor layers with a dielectric lying therebetween, the semiconductor layers being respectively covered by a dielectric layer at both sides facing away from one another, said dielectric layers separating the semiconductor layers from conductive regions;

a control electrode arranged at an end face of the layer structure formed at least by the semiconductor layers and the dielectric upon interposition of an insulating layer and that controls a flow of current through the layer structure; and the dielectric comprising oxynitride and the dielectric layers comprising silicon nitride.

12. The semiconductor component according to claim 1 wherein the two semiconductor layers are designed as one of intrinsically conductive and lightly doped polysilicon layers.

* * * * *